United States Patent
Joo

(10) Patent No.: US 7,304,894 B2
(45) Date of Patent: Dec. 4, 2007

(54) NON-VOLATILE MEMORY DEVICE AND METHOD OF PREVENTING HOT ELECTRON PROGRAM DISTURB PHENOMENON

(75) Inventor: Seok Jin Joo, Seoul (KR)

(73) Assignee: Hynix Semiconductor Inc., Icheon-Si (KR)

(*) Notice: Subject to any disclaimer, the term of this patent is extended or adjusted under 35 U.S.C. 154(b) by 133 days.

(21) Appl. No.: 11/291,866

(22) Filed: Nov. 30, 2005

(65) Prior Publication Data

US 2006/0227613 A1 Oct. 12, 2006

(30) Foreign Application Priority Data

Apr. 11, 2005 (KR) .............. 10-2005-0030048

(51) Int. Cl.
*G11C 16/04* (2006.01)
*G11C 5/14* (2006.01)
*G11C 7/00* (2006.01)

(52) U.S. Cl. .......................... 365/185.28; 365/185.17; 365/185.18; 365/185.24; 365/189.09; 365/189.11

(58) Field of Classification Search ........ 365/185.28, 365/185.17, 185.18, 185.24, 189.09, 189.11
See application file for complete search history.

(56) References Cited

U.S. PATENT DOCUMENTS 5,812,457 A * 9/1998 Arase ................. 365/185.22
5,978,267 A * 11/1999 Chen et al. ........... 365/185.17

FOREIGN PATENT DOCUMENTS

| KR | 1996-035654 | 10/1996 |
| KR | 10-2002-0054511 A | 7/2002 |
| KR | 100496797 B1 | 6/2005 |
| KR | 10-2005-0109835 A | 11/2005 |

* cited by examiner

*Primary Examiner*—Ly Duy Pham
(74) *Attorney, Agent, or Firm*—Townsend & Townsend & Crew LLP

(57) ABSTRACT

A method for preventing generation of program disturbance incurred by hot electrons in a NAND flash memory device. A channel boosting disturb-prevention voltage lower than a program-prohibit voltage applied to other word lines is applied to edge word lines coupled to memory cells that are nearest to select transistors. As a result, an electric field between the memory cells coupled to the edge word lines and the select transistors is weakened, and the energy of the hot electrons is reduced.

11 Claims, 16 Drawing Sheets

FIG. 2
(PRIOR ART)

| LINE | BIAS VOLTAGE DURING PROGRAM OPERATION (Volt) |
|---|---|
| Vpgm | 16 ~ 20V |
| Vpass | 8 ~ 10 |
| DSL | VCC |
| SSL | 0 |
| CSL | VCC |
| BLo(SELECTED) | 0 |
| BLe(NOT SELECTED) | VCC |
| BULK | 0 |

FIG. 7

| LINE NAME | BIAS VOLTAGE UPON PROGRAMMING OF WL1~WL30 (Volt) | BIAS VOLTAGE UPON PROGRAMMING OF WL0 or WL31(Volt) |
|---|---|---|
| Vpgm | 16~20 | 16~20 (WL0 or WL31) |
| Vcbd(WL0 & WL31) | 4~9(4~7) | 4~9(4~7)(WL0 or WL31) |
| Vpass(WL1 ~ WL30) | 8~10 | 8~10 |
| DSL | VCC | VCC |
| SSL | 0 | 0 |
| CSL | VCC | VCC |
| BLo(SELECTED) | 0 | 0 |
| BLe(NOT SELECTED) | VCC | VCC |
| BULK | 0 | 0 |

FIG. 11

| LINE NAME | BIAS VOLTAGE UPON PROGRAMMING OF WL1~WL30 (Volt) | BIAS VOLTAGE UPON PROGRAMMING OF WL0 or WL31 (Volt) | BIAS VOLTAGE UPON PROGRAMMING OF WL1 or WL30 (Volt) |
|---|---|---|---|
| Vpgm | 16~20 | 16~20 (WL0 or WL31) | 16~20 (WL1 or WL30) |
| Vcbd(WL0 & WL31) | 2~8(2~6) | 2~8(2~6)(WL0 or WL31) | 2~8(2~6)(WL0 & WL31) |
| Vcbd2(WL1 & WL30) | 4~9(4~7) | 4~9(4~7)(WL1 & WL30) | 4~9(4~7)(WL1 or WL30) |
| Vpass(WL2~WL29) | 8~10 | 8~10 | 8~10 |
| DSL | VCC | VCC | VCC |
| SSL | 0 | 0 | 0 |
| CSL | VCC | VCC | VCC |
| BLo(SELECTED) | 0 | 0 | 0 |
| BLe(NOT SELECTED) | VCC | VCC | VCC |
| BULK | 0 | 0 | 0 |

FIG. 14

| LINE NAME | BIAS VOLTAGE UPON PROGRAMMING OF WL1~W30 (Volt) |
|---|---|
| Vpgm | 16~20 |
| Vpass | 5~9 |
| DSL | VCC |
| SSL | 0 |
| CSL | VCC |
| BLo(SELECTED) | 0 |
| BLe(NOT SELECTED) | VCC |
| BULK | 0 |

NON-VOLATILE MEMORY DEVICE AND METHOD OF PREVENTING HOT ELECTRON PROGRAM DISTURB PHENOMENON

BACKGROUND

1. Field of the Invention

The present invention relates to a non-volatile memory device and method of preventing a hot electron program disturb phenomenon, and more specifically, a method of preventing generation of program disturbance incurred by hot electrons in a NAND flash memory device.

2. Discussion of Related Art

There is an increasing demand for semiconductor memory devices which can be electrically programmed and erased without a refresh function of rewriting data at a predetermined cycle. The term "program" refers to an operation of writing data into memory cells.

In order to increase the level of integration of memory devices, a NAND flash memory device in which a plurality of memory cells is connected in series (i.e., a structure in which neighboring cells share the drain or source) to form one string has been developed. The NAND flash memory device is a memory device that sequentially reads information, unlike a NOR flash memory device.

FIG. 1 is a circuit diagram of a conventional NAND flash memory device. FIG. 2 is a table showing a program voltage condition of the NAND flash memory device shown in FIG. 1.

Referring to FIGS. 1 and 2, a selected bit line BLo is supplied with the ground voltage (0V), a non-selected bit line BLe is supplied with the power supply voltage (VCC), a drain select line DSL is supplied with the power supply voltage (VCC), a source select line SSL is supplied with the ground voltage (0V), a word line WL2 is supplied with a program voltage (Vpgm) of about 16 to 19V, and the remaining word lines WL0, WL1, WL3 to WL31 are supplied with a pass voltage, i.e., a program-prohibit voltage (Vpass) of 8V to 10V. If the aforementioned program voltage condition is fulfilled, data are programmed into a memory cell MC2'.

The NAND flash memory device shown in FIG. 1 has two kinds of disturb modes in a program operation. One mode is Vpass disturb mode and the other mode is Vpgm disturb mode.

In Vpass disturb mode, memory cells MC0', MC1', MC3' to MC31' are disturbed. These memory cells exist in the same string 12 as the memory cell MC2' to be programmed. The term "Vpass disturb" refers to a phenomenon in which the memory cells MC0', MC1', MC3' to MC31' are programmed under the condition in which a voltage of each of the word lines WL0 to WL1 and WL3 to WL31 is 10V and a channel voltage of each of the memory cells MC0', MC1', MC3' to MC31' is 0V.

In Vpgm disturb mode, the memory cell MC2 is disturbed. This memory cell exists in the same word line WL2 as the cell MC2' to be programmed. The term "Vpgm disturb" refers to a phenomenon in which the memory cell MC2 is programmed under the condition in which a voltage of the word line WL2 is 18V and a channel voltage of the memory cell MC2 is 8V.

The channel voltage of the memory cells MC0 to MC31 connected to the non-selected bit line BLe to which the power supply voltage (VCC) is applied is all boosted to 8V. This is because the non-selected bit line BLe is supplied with the power supply voltage (VCC) unlike the selected bit line BLo.

One reason why the channel is boosted to 8V will be described below with reference to FIG. 3.

If the non-selected bit line BLe is supplied with the power supply voltage (VCC) and a drain select transistor DST is turned on, a voltage is shifted toward the channels of the memory cells MC0 to MC31 as much as (Vcc−Vt) (where, Vt is the threshold voltage of DST), so that the channel of the memory cells MC0 to MC31 are initially charged with (Vcc−Vt). The drain select transistor DST is then turned off without forming a channel.

Tunnel oxide film capacitance (Cox) and Oxide Nitride Oxide (ONO) capacitance (Cono) exist between the channel of the memory cells MC0 to MC31 and a control gate CG. Depletion capacitance (Cch) exists between the channel and a bulk (a substrate Si-Sub). Therefore, channels Vch0 to Vch31 are boosted to match the coupling of three kinds of capacitance (Cono, Cox, and Cch) equaling about 8V.

The program-prohibit cells MC0 to MC31 connected to the non-selected bit line BLe to which the power supply voltage (Vcc) is supplied are not programmed.

Vpass disturb and Vpgm disturb are factors that have significant influence on the yield of NAND flash memory products.

However, additional disturb phenomena, such as channel boosting disturb and hot electron program disturb, occur as the size of memory cells is reduced to 100 nm or less. The term "channel boosting disturb" refers to a phenomenon in which data are programmed into unwanted memory cells MC0 and MC31 by hot electrons generated as the channels Vch0 to Vch31 of the memory cells MC0 to MC31 are boosted.

The channel boosting disturb phenomenon by these hot electrons is typically generated only in the memory cells MC0, MC31 connected to the edge word lines WL0, WL31 within the non-selected string 11 shown in FIG. 3. Of them, the channel boosting disturb phenomenon is generated in the memory cell MC0 connected to most of the word line WL0.

The channel boosting disturb phenomenon by hot electrons will be described in more detail below with reference to FIG. 3.

A channel Vchs of a source select transistor SST is fixed to a voltage of about 0V by its gate voltage (0V). A channel Vchd of a drain select transistor DST is fixed to a voltage of about 1V by its gate voltage (VCC). However, the channels Vch0, Vch31 of the memory cells MC0, MC31 are boosted to about 8V, as described above.

An electric field of a strong lateral direction (an electric field due to a voltage difference between the channel voltage of 0V of SST and the channel voltage of 8V of MC0) exists between the source select transistor SST and the memory cell MC0. An electric field of a strong lateral direction (an electric field due to a voltage difference between the channel voltage of 1V of DST and the channel voltage of 8V of MC31) also exists between the drain select transistor DST and the memory cell MC31.

One reason why the channel boosting disturb phenomenon by the hot electrons is generally generated in the memory cells MC0 connected to the word line WL0 is that a voltage difference between the channel voltage (Vchs) 0V of the source select transistor SST and the channel voltage (Vch0) 8V of the memory cell MC0 is greater than a voltage difference between the channel voltage (Vchd) 1V of the drain select transistor DST and the channel voltage (Vch31) 8V of the memory cell MC31.

In addition, current of electrons and holes (e-h pair) is generated at the interface between a gate oxide film of the source select transistor SST and a silicon substrate Si-Sub. The holes exit toward the silicon substrate Si-Sub and the electrons move toward the memory cell MC0 along the surface of the silicon substrate Si-Sub. The same phenomenon as those described above is also generated at the interface between the gate oxide film of the source select transistor SST and the silicon substrate Si-Sub.

If the electrons pass through the strong electric field of the lateral direction as described above, the electrons become hot electrons. If these hot electrons are scattered around the memory cells MC0, MC31, the hot electrons are introduced into a floating gate FG of the memory cells MC0, MC31, so that data are programmed into the program-prohibit cells MC0, MC31.

The smaller the size of the memory cells, the stronger the electric field of the lateral direction (since the distance between MC0 and SST or MC31 and DST is narrowed). Therefore, the smaller the size of the memory cells, the more severe the channel boosting disturb phenomenon by hot electrons.

Furthermore, a Multi Level Cell (MLC) flash memory device uses a high program voltage (Vpgm) and a high program-prohibit voltage (Vpass). Therefore, to keep the threshold voltage distribution of the MLC very narrow, the MLC has program pulses, which are 6 times greater than that of a Single Level Cell (SLC). This causes the MLC to have more severe channel boosting disturbance by the aforementioned hot electrons.

FIG. 4 is a view showing that channel boosting disturb by hot electrons has occurred in the memory cells MC0, MC31 connected to the edge word line WL0, WL31.

In FIG. 4, portions illustrated by black lines indicate fail bits.

FIG. 5 is a graph showing the relation between a threshold voltage (Vt) of the cells MC0, MC31 (cells in which channel boosting disturb by hot electrons is generated) and the program-prohibit voltage (Vpass).

From FIGS. 4 and 5, it can be seen that the memory cells MC0, M31 connected to the edge word lines WL0, WL31 have a characteristic quite different from the memory cells MC1 to MC30 connected to other word lines WL1 to WL30.

SUMMARY OF THE INVENTION

Embodiments of the present invention prevent program disturbance by hot electrons resulting in a weaker electric field between memory cells connected to edge word lines and a select transistor.

According to one embodiment of the present invention, a method of preventing hot electron program disturbance of a non-volatile memory device includes boosting channels of a first group of memory cells to a first voltage. This first group of memory cells is connected to a first and an $N^{th}$ word line of N (where N is a positive integer) word lines of memory cells connected in series between a first select transistor coupled to bit lines and a second select transistor. The second select transistor is coupled to a common source line and a bit line. The method further includes boosting channels of a second group of memory cells to a second voltage, the second group of memory cells connected to the remaining word lines other than the first and $N^{th}$ word line. The second group of memory cells is also coupled to a program word line and non-selected bit lines. In this embodiment, the first voltage is lower than the second voltage.

According to another embodiment of the present invention, a method of preventing hot electron program disturbance of a non-volatile memory device includes boosting channels of a first group of memory cells to a first voltage. This group of memory cells is connected to a first and an $N^{th}$ word line of N (where N is a positive integer) word lines of memory cells connected in series between a first select transistor coupled to bit lines and a second select transistor. The second select transistors is coupled to a common source line and a bit line. The method further includes boosting channels of a second group of memory cells to a second voltage, which are connected to the second and the $(N-1)^{th}$ word lines that are nearest to the first and the $N^{th}$ word lines and the non-selected bit lines. The method further includes boosting channels of a third group of memory cells to a third voltage, the third group of memory cells connected to the remaining word lines other than the first and $N^{th}$ edge word lines, the second and $(N-1)^{th}$ word lines. The third group of memory cells is also coupled to a program word line and the non-selected bit lines. In this embodiment, the first voltage is lower than the second voltage, and the second voltage is lower than the third voltage.

According to still another embodiment of the present invention, a method of preventing hot electron program disturbance of a non-volatile memory device includes applying a program voltage to one of N number of word lines of memory cells. These memory cells are connected in series between a first select transistor and a second select transistor, the second select transistor coupled to a common source line. The method further includes applying a channel boosting disturb-prevention voltage to the first and the $N^{th}$ edge word lines; and applying a program-prohibit voltage to the remaining word lines. In this embodiment, the channel boosting disturb-prevention voltage is lower than the program-prohibit voltage.

According to another embodiment of the present invention, a method of preventing hot electron program disturbance of a non-volatile memory device includes applying a program voltage to one of N (where N is a positive integer) word lines of memory cells, which are connected in series between a first select transistor and a second select transistor, the second select transistor coupled to a common source line The method further includes applying a first channel boosting disturb-prevention voltage to the first and the $N^{th}$ edge word lines; applying a second channel boosting disturb-prevention voltage to the second and the $(N-1)^{th}$ word lines; and applying a program-prohibit voltage to the remaining word lines. In this embodiment, the first channel boosting disturb-prevention voltage is lower than the second channel boosting disturb-prevention voltage, and the second channel boosting disturb-prevention voltage is lower than the program-prohibit voltage.

According to still another embodiment of the present invention, a non-volatile memory device includes a memory cell array including memory cells in a region of word lines and bit lines crossing each other, wherein the memory cell array is connected in series between a first select transistor in which the memory cells are coupled to the bit lines, respectively, and a second select transistor coupled to a common source line; a pump circuit that generates a program voltage and a program-prohibit voltage; and a voltage dividing unit that divides the program-prohibit voltage output from the pump circuit generating a channel boosting disturb-prevention voltage lower than the program-prohibit voltage. The voltage dividing unit also applies the generated channel boosting disturb-prevention voltage to the first and the $N^{th}$ word line.

BRIEF DESCRIPTION OF THE DRAWINGS

FIG. 2 is a table showing a program voltage condition of the NAND flash memory device shown in FIG. 1;

FIG. 7 is a table showing a program voltage condition of the NAND flash memory device shown in FIG. 6;

FIG. 11 is a table showing a program voltage condition of the NAND flash memory device shown in FIG. 10;

FIG. 14 is a table showing a program voltage condition of the NAND flash memory device shown in FIG. 13;

DETAILED DESCRIPTION OF EMBODIMENTS

Embodiments of the present invention will be described with reference to the accompanying drawings. These embodiments are provided so that those ordinary skilled in the art can understand the present invention. It should be appreciated that the embodiments of the present invention may be modified in various manners without departing from the scope of the present invention.

Figure 6:
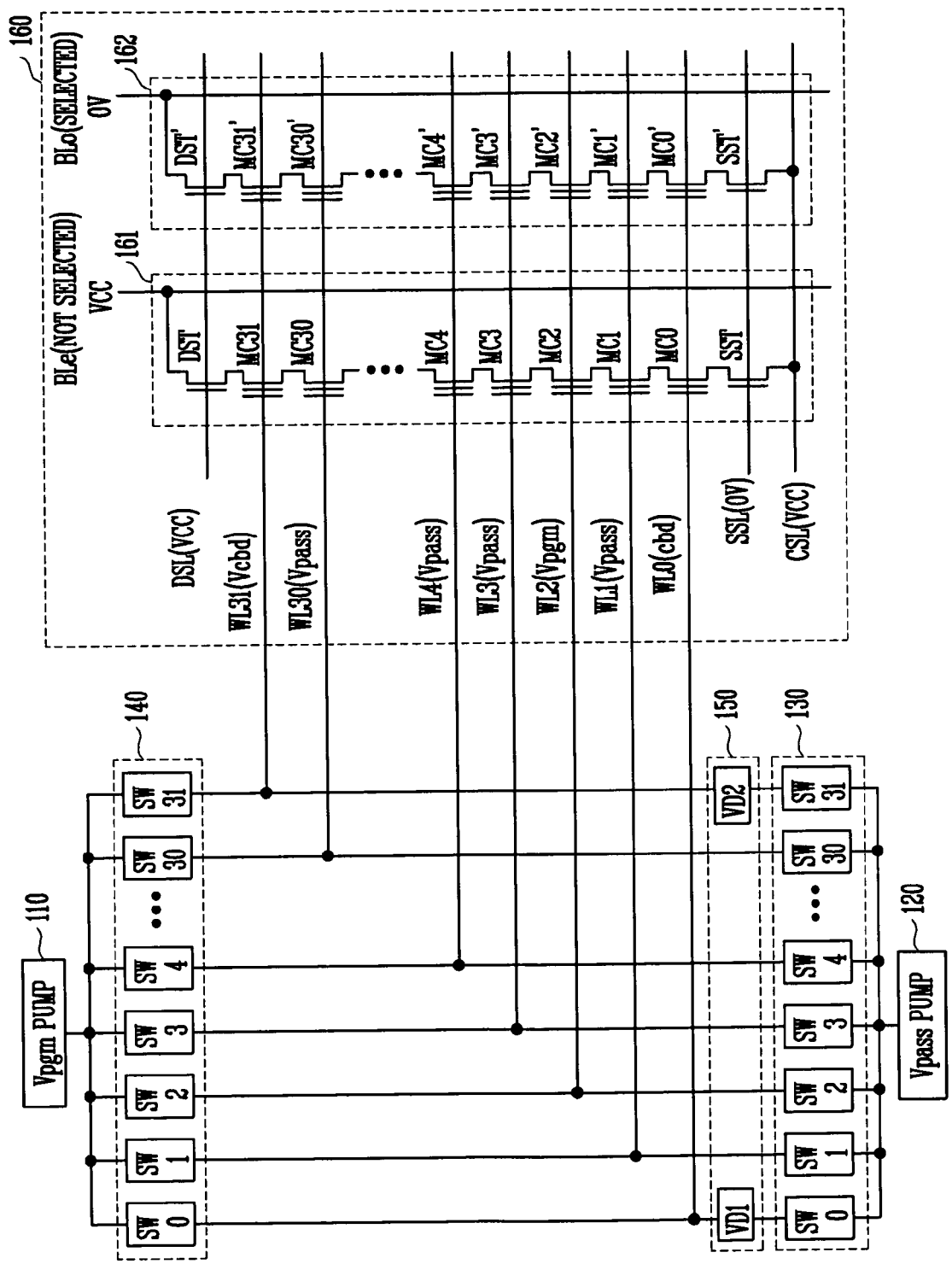
FIG. 6 is a circuit diagram of a NAND flash memory device according to one embodiment of the present invention.

FIG. 6 is a circuit diagram of a NAND flash memory device according to one embodiment of the present invention. FIG. 7 is a table showing a program voltage condition of the NAND flash memory device shown in FIG. 6.

Referring to FIG. 6, the NAND flash memory device includes a Vpgm pump 110, a Vpass pump 120, switching units 130, 140, a voltage divider 150, and a memory cell array 160.

Memory cell array 160 includes memory cells MC, a source select transistor SST, and a drain select transistor DST. Bit lines BLe, BLo each acting as drains to memory cell array 160 are coupled to drain select transistor DST for selecting a drain select line DSL. A common source line CSL acting as the source to memory cell array 160 is coupled to the source select transistor SST for selecting a source select line SSL. In one embodiment of the present invention, the number of memory cells MC, which are connected in series between the drain select transistor DST and the source select transistor SST, can be 16, 32 or 64 depending on the device and density. Although two strings 161, 162 displaying 32 memory cells for each string are shown in FIG. 6, the number of the strings can vary. Each memory cell (e.g., MC1) is controlled by one word line (e.g., WL1) and forms one page. In FIG. 6, 32 pages are shown.

The Vpgm pump 110 generates a program voltage (Vpgm) and the Vpass pump 120 generates a program-prohibit voltage (Vpass).

The Vpass switching unit 130 includes the same number of switching elements SW0 to SW31 as that of word lines and applies the program-prohibit voltage (Vpass) to word lines that are not programmed. The Vpgm switching unit 140 also includes the same number of switching elements SW0 to SW31 as that of word lines and applies the program voltage (Vpgm) to a word line to be programmed.

Furthermore, to apply the program voltage (Vpgm) to a selected word line during the program operation, the switching elements SW0 to SW31 of the Vpgm switching unit 140 are turned on and the switching elements SW0 to SW31 of the Vpass switching unit 130 are turned off. To apply the program-prohibit voltage (Vpass) to non-selected word lines, the switching elements SW0 to SW31 of the Vpgm switching unit 140 are turned off and the switching elements SW0 to SW31 of the Vpass switching unit 130 are turned on.

The voltage divider 150 includes two voltage dividers, VD1 and VD2. The voltage dividers VD1, VD2 divide the program-prohibit voltage (Vpass), which is received through the Vpass switching elements SW0, SW31, generating a channel boosting disturb-prevention voltage (Vcbd). The generated channel boosting disturb-prevention voltage (Vcbd) is applied to edge word lines WL0 and WL31.

In accordance with an embodiment of the present invention, voltage dividers VD1, VD2 are installed only in the Vpass switching elements SW0, SW31 (i.e., only in global word lines). In this case, these voltage dividers VD1, VD2 rarely affects the chip size. The voltage dividers VD1, VD2 can be formed using several diodes or several resistors without implementing a complicated logic. Detailed description thereof will be omitted.

A program voltage condition will be described below with reference to FIGS. 6 and 7.

For example, in the case where data is programmed into the memory cell MC2', the odd bit line BLo is supplied with a ground voltage (0V), the even bit line BLe is supplied with a power supply voltage (VCC), the drain select line DSL is supplied with the power supply voltage (VCC), the source select line SSL is supplied with the ground voltage (0V), word line WL2 is supplied with a program voltage (Vpgm) of about 16 to 20V, edge word lines WL0, WL31 are supplied with a channel boosting disturb-prevention voltage (Vcbd) of 4 to 9V or 4 to 7V, and the remaining word lines WL1, WL3 to WL30 are supplied with a program-prohibit voltage (Vpass) of 8V to 10V, as shown in FIGS. 6 and 7.

In another example, in the case where data is programmed into the memory cells MC0', word line WL0 is supplied with the program voltage (Vpgm) of about 16 to 20V, edge word line WL31 is supplied with the channel boosting disturb-prevention voltage (Vcbd) of 4 to 9V or 4 to 7V, and the remaining word lines WL1 to WL30 are supplied with the program-prohibit voltage (Vpass) of 8V to 10V, as shown in FIG. 7. In the case where data is programmed into the memory cells MC31', the word line WL31 is supplied with the program voltage (Vpgm) of about 16 to 20V, edge word line WL0 is supplied with the channel boosting disturb-prevention voltage (Vcbd) of 4 to 9V or 4 to 7V, and the remaining word lines WL1 to WL30 are supplied with the program-prohibit voltage (Vpass) of 8V to 10V, as shown in FIG. 7.

Figure 8:
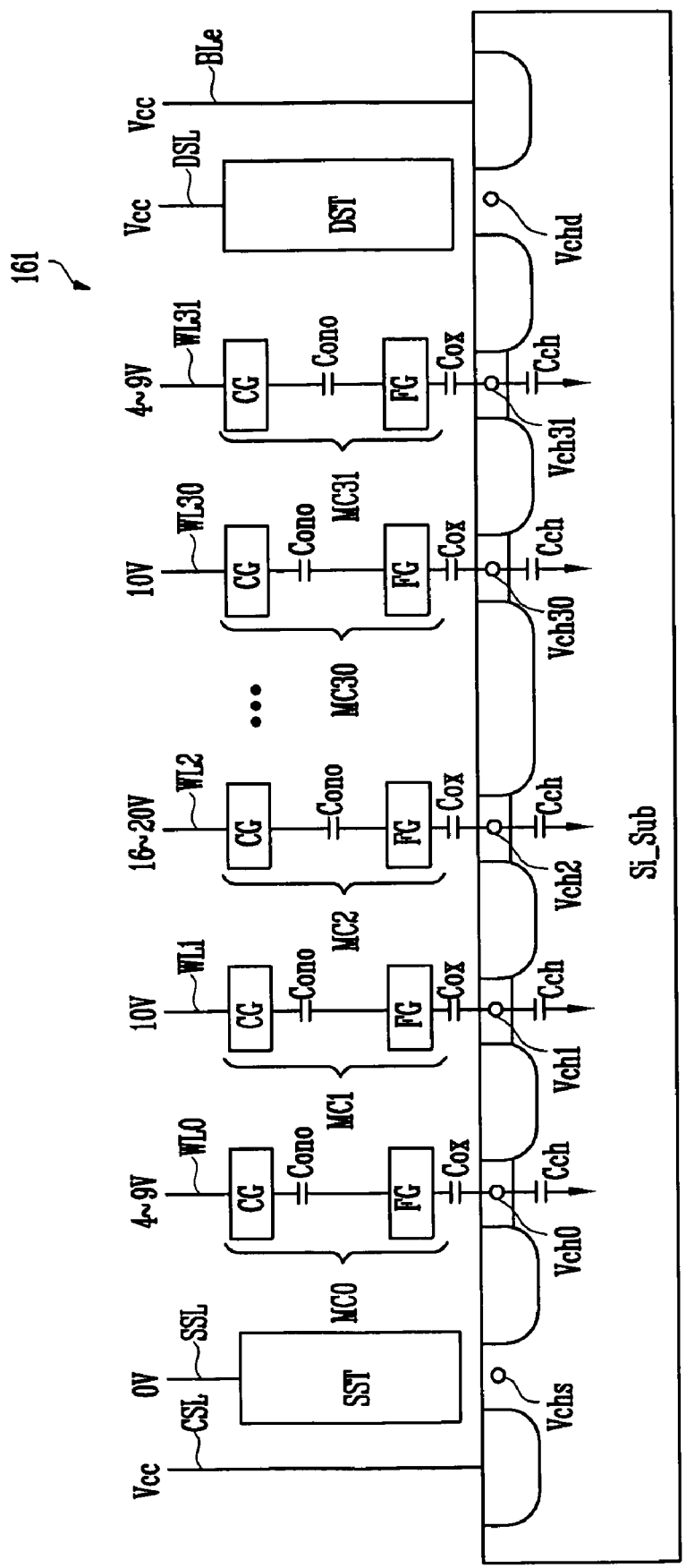
FIG. 8 is a sectional view of a non-selected string shown in FIG. 6.
Figure 9:
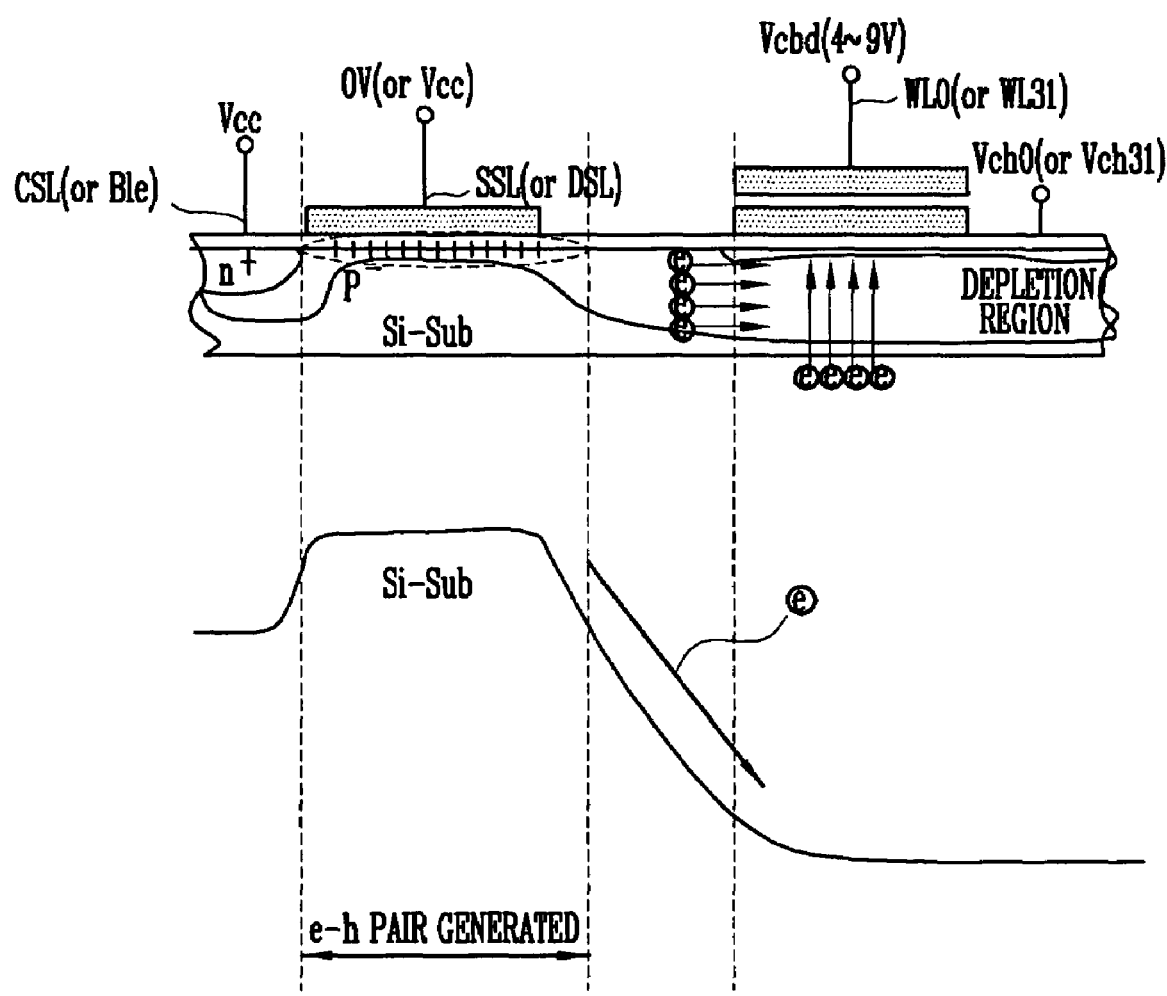
FIG. 9 is a detailed sectional view of a memory cell connected to the select transistors and the edge word line shown in FIG. 8.

FIG. 8 is a sectional view of one string 161 shown in FIG. 6. FIG. 9 is a sectional view of the source select transistor SST and the memory cell MC0, or a detailed sectional view of the drain select transistor DST and the memory cell MC31 of FIG. 8.

A method of preventing hot electron program disturbance will be described in detail below with reference to FIGS. 8 and 9. In accordance with one embodiment of the present invention, hot electron program disturbance is generated only in cell string 161 connected to a non-selected bit line BLe.

Referring to FIG. 8, a word line to be programmed (e.g., WL2) is supplied with the program voltage (Vpgm) of 16V to 29V, edge word lines WL0, WL31 are supplied with the channel boosting disturb-prevention voltage (Vcbd) of 4 to 9V (or 4 to 7V), and the remaining word lines WL1, WL3 to WL30 are supplied with the program-prohibit voltage (Vpass) of 8V to 10V.

For example, if word line WL2 is to be programmed, word line WL2 is supplied with the program voltage (Vpgm) of 18V, the remaining word lines WL1, WL3 to WL30 are supplied with the program-prohibit voltage (Vpass) of 10V, and the edge word lines WL0, WL31 are supplied with the channel boosting disturb-prevention voltage (Vcbd) of 4 to 9V. In another embodiment of the present invention, if the word lines WL1, WL2 to WL30 are supplied with the program-prohibit voltage (Vpass) of 8V, the edge word lines WL0, WL31 are supplied with the channel boosting disturb-prevention voltage (Vcbd) of 4 to 7V.

The voltage condition as shown in FIG. 8 results in a reduced electric field between source select transistor SST and memory cell MC0, and a reduced electric field between drain select transistor DST and memory cell MC31.

In FIG. 8, the channel Vchs of the source select transistor SST is fixed to about the ground voltage (0V) by its gate voltage (0V). Channel Vchd of the drain select transistor DST has a voltage of about 1V by the gate voltage (VCC). Channel Vch0 of memory cell MC0 and channel Vch31 of memory cell M31 are boosted to about 5 to 6V. Previously, channel Vch0 is supplied with a voltage of 4 to 9V through the edge word line WL0, and channel Vch31 of the memory cell M31 is supplied with a voltage of 4 to 9V through the edge word line WL31. In addition, channels Vch1, Vch3 to Vch30 of the memory cells MC1, WL3 to MC30, are boosted to about 8V. These memory cells are previously supplied with a voltage of 8 to 10V through the word lines WL1, WL3 to WL30, respectively. In this embodiment, channels Vch0, Vch31 of the memory cells MC0, MC31 are boosted to about 5 to 6V. However, the present invention is not restricted by this voltage range. In another embodiment, channels Vch0, Vch31 of the memory cells MC0, MC31 can be boosted to about 8V or less.

An electric field of a lateral direction (an electric field due to a voltage difference between the channel voltage 0V of SST and the channel voltage 5 to 6V of MC0) exists between the source select transistor SST and the memory cell MC0, as shown in FIG. 9. An electric field of a lateral direction (an electric field due to a voltage difference between the channel voltage 1V of DST and the channel voltage 5 to 6V of MC31) also exists between the drain select transistor DST and the memory cell MC31, as shown in FIG. 9. In this case, since the voltage of 4 to 9V is applied to the edge word lines WL0, WL31, the electric field of the lateral direction in FIG. 9 becomes weaker than the electric field of the lateral direction.

Current of electron and hole pairs (e-h pair) or the leakage current by Gate Induced Drain Leakage (GIDL) is generated at the interface between a gate oxide film of the source select transistor SST and a silicon substrate Si-Sub and between a gate oxide film of the drain select transistor DST and the silicon substrate Si-Sub. The holes generated exit the silicon substrate Si-Sub and electrons are moved toward the memory cells MC0 or MC31 along the surface of the silicon substrate Si-Sub.

If the electrons pass through the electric field (the electric field becomes weak since a voltage difference is reduced) of the lateral direction, the electrons become hot electrons with weaker energy. Hot electrons having weak energy do not enter a floating gate FG of the memory cells MC0, MC31, although the hot electrons scatter around the memory cells MC0, MC31. This is because these hot electrons have weak energy and are not able to move in a longitudinal direction. For this reason, hot electron program disturbance is not generated in the program-prohibit cells MC0, MC31.

Figure 10:
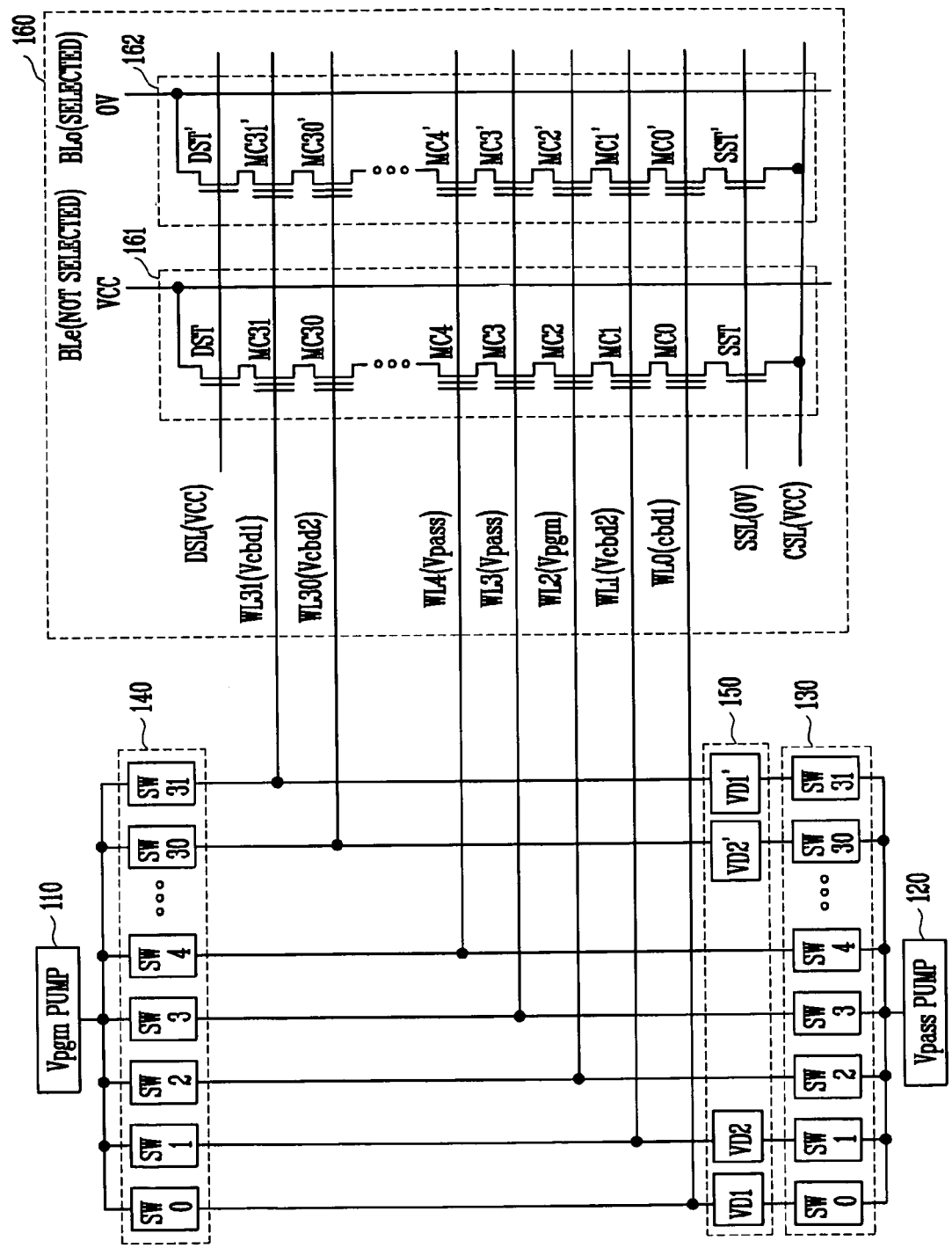
FIG. 10 is a circuit diagram of a NAND flash memory device according to another embodiment of the present invention.

FIG. 10 shows a NAND flash memory device for preventing hot electron program disturbance according to one embodiment of the present invention. FIG. 11 shows a program voltage condition of the NAND flash memory device shown in FIG. 10.

Referring to FIG. 10, the NAND flash memory device includes a Vpgm pump 110, a Vpass pump 120, switching units 130, 140, a voltage divider 150, and a memory cell array 160.

The NAND flash memory device shown in FIG. 10 is different from that of FIG. 6 in that the voltage divider 150 of FIG. 6 includes two voltage dividers, whereas the voltage divider 150 of FIG. 10 includes four voltage dividers VD1, VD1', VD2, and VD2'. In FIG. 10, the two voltage dividers VD1, VD1' divide a program-prohibit voltage (Vpass) to generate a channel boosting disturb-prevention voltage (Vcbd1). The two voltage dividers VD2, VD2' divide the program-prohibit voltage (Vpass) to generate a channel boosting disturb-prevention voltage (Vcbd2).

The program voltage condition of FIG. 11 is different from that of FIG. 7 in which voltage is applied to word lines that will not be programmed in order to prevent hot electron program disturbance. In FIG. 7, the word lines WL0, WL31 are supplied with the channel boosting disturb-prevention voltage (Vcbd) of 4 to 9V (or 4 to 7V), whereas in FIG. 11, the word lines WL0, WL31 are supplied with the channel boosting disturb-prevention voltage (Vcbd1) of 2 to 8V (or 2 to 6V) and the word lines WL1, WL30 are supplied with the channel boosting disturb-prevention voltage (Vcbd2) of 4 to 9V (or 4 to 7V).

Figure 12:
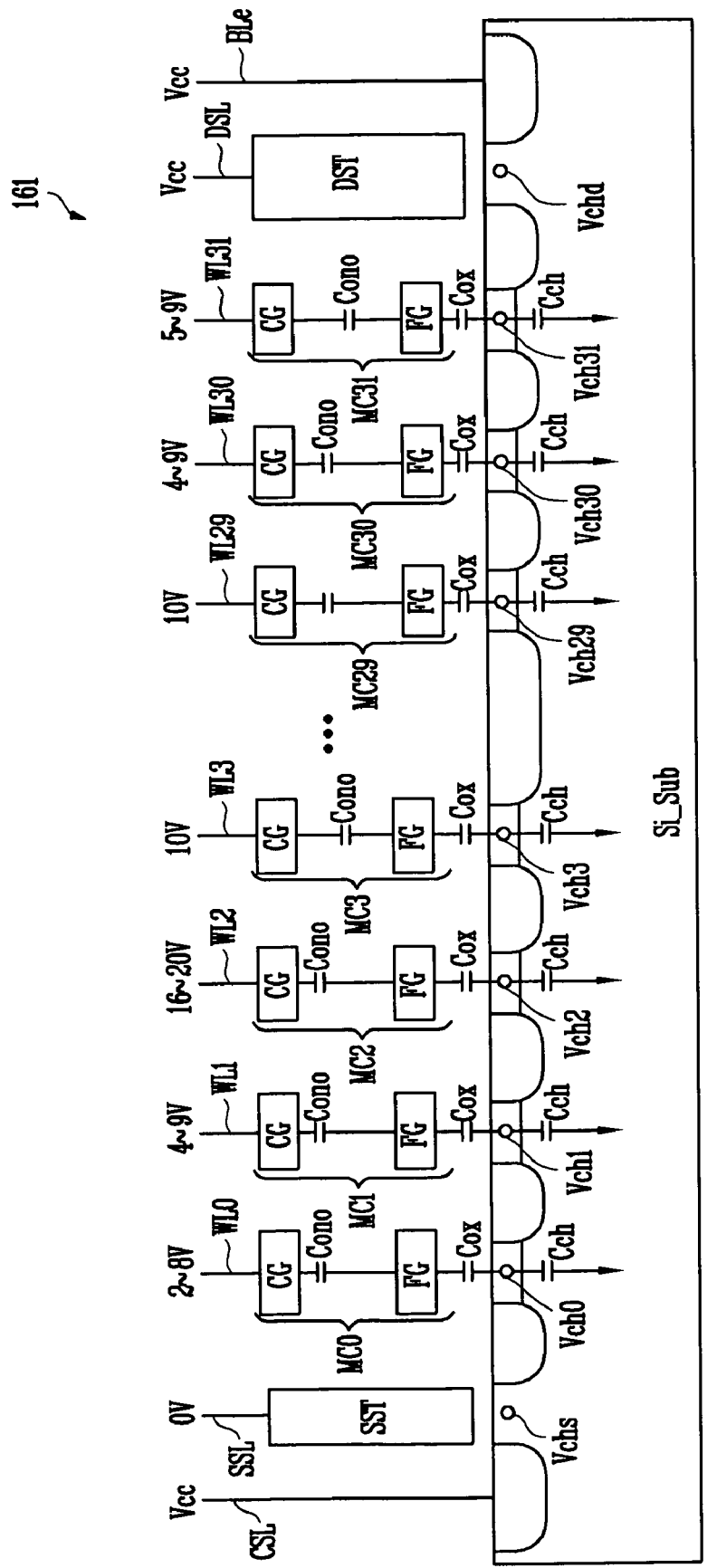
FIG. 12 is a sectional view of a non-selected string shown in FIG. 10.

FIG. 12 is a sectional view of a non-selected string 161 shown in FIG. 10. A method of preventing hot electron program disturbance will be described in detail with reference to FIG. 12.

Referring to FIG. 12, a word line (e.g., WL2) is supplied with the program voltage (Vpgm) of 16 to 20V, the edge word lines WL0, WL31 are supplied with the channel boosting disturb-prevention voltage (Vcbd1) of 2 to 8V, the word lines WL1, WL30 are supplied with the channel boosting disturb-prevention voltage (Vcbd2) of 4 to 9V, and the remaining word lines WL1, WL3 to WL30 are supplied with the program-prohibit voltage (Vpass) of 8V to 10V.

For example, if the word line WL2 to be programmed is supplied with the program voltage (Vpgm) of 18V and the remaining word lines WL3 to WL29 are supplied with the program-prohibit voltage (Vpass) of 10V, the edge word lines WL0, WL31 are supplied with the channel boosting disturb-prevention voltage (Vcbd1) of 2 to 8V and the word lines WL0, WL31 are supplied with the channel boosting disturb-prevention voltage (Vcbd2) of 4 to 9V. In another embodiment of the present invention, word lines WL3 to WL29 are supplied with the program-prohibit voltage (Vpass) of 8V, the edge word lines WL0, WL31 are supplied with the channel boosting disturb-prevention voltage (Vcbd1) of 2 to 6V, and the word lines WL1, WL30 are supplied with the channel boosting disturb-prevention voltage (Vcbd2) of 4 to 7V.

If a voltage condition as shown in FIG. 12 is fulfilled, an electric field between the source select transistor SST and the memory cells MC0, MC1 becomes weaker. An electric field between the drain select transistor DST and the memory cells MC30, MC31 also becomes weaker.

This will be described in more detail. In FIG. 11, the channel Vchs of the source select transistor SST is fixed to about the ground voltage (0V) by its gate voltage (0V). The channel Vchd of the drain select transistor DST has a voltage of about 1V by its gate voltage (VCC). The channels Vch3 to Vch29 of the memory cells MC3 to MC29 are boosted to about 8V, the channels Vch1, Vch30 of the memory cells MC1, MC30 are boosted to about 5 to 6V, and the channels Vch0, Vch31 of the memory cells MC0, MC31 are boosted to a voltage lower than 5 to 6V. It should be appreciated that the boosting voltage is not restricted by 5 to 6V. For example, the boosting voltage could also be about 8V or less.

As described above, the channels Vch3 to Vch29 are boosted to about 8V, the channels Vch1, Vch30 are boosted to about 5 to 6V and the channels Vch0, Vch31 are boosted to 5 to 6V or less. Hot electron program disturbance due to the phenomenon that has been described with reference to FIG. 9 is not generated in the program-prohibit cells MC0, MC31.

Figure 13:
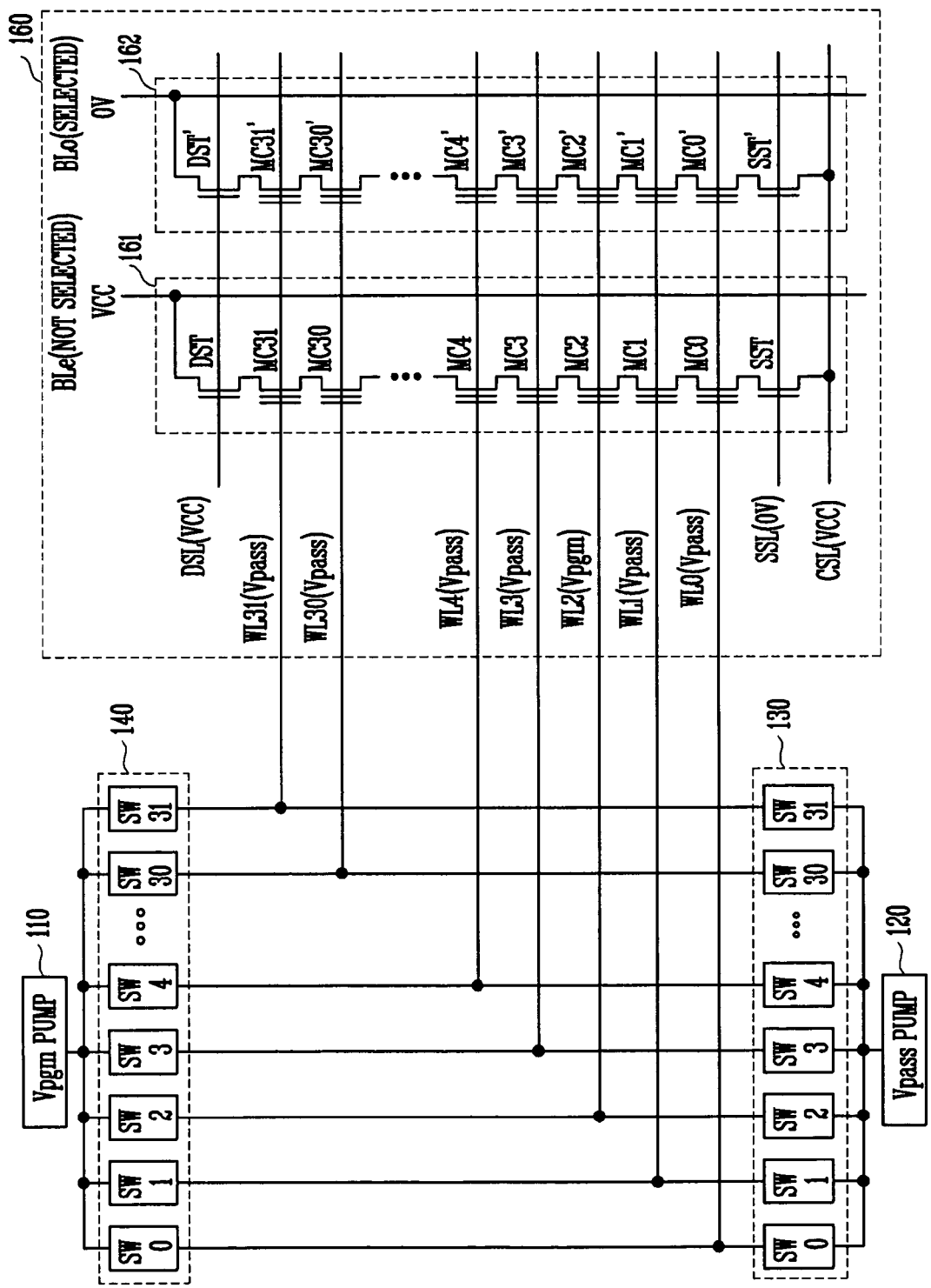
FIG. 13 is a circuit diagram of a NAND flash memory device according to still another embodiment of the present invention.

FIG. 13 shows a NAND flash memory device for preventing hot electron program disturbance according to another embodiment of the present invention. FIG. 14 shows a program voltage condition of the NAND flash memory device shown in FIG. 13.

Referring to FIG. 13, the NAND flash memory device includes a Vpgm pump 110, a Vpass pump 120, switching units 130, 140, and a memory cell array 160. The NAND flash memory device of FIG. 13 is different from those of FIGS. 6 and 10 in that in FIGS. 6 and 10, the voltage divider 150 exists, whereas in FIG. 13, the voltage divider does not exist.

Furthermore, FIG. 14 is different from FIGS. 7 and 11 in the voltage applied to word lines that are not programmed in order to prevent hot electron program disturbance. In FIG. 14, to prevent hot electron program disturbance, the remaining word lines WL0, WL1, WL3 to WL31 except for a program word line (e.g., WL2), are supplied with of the program-prohibit voltage (Vpass) of 5 to 9V.

Figure 15:
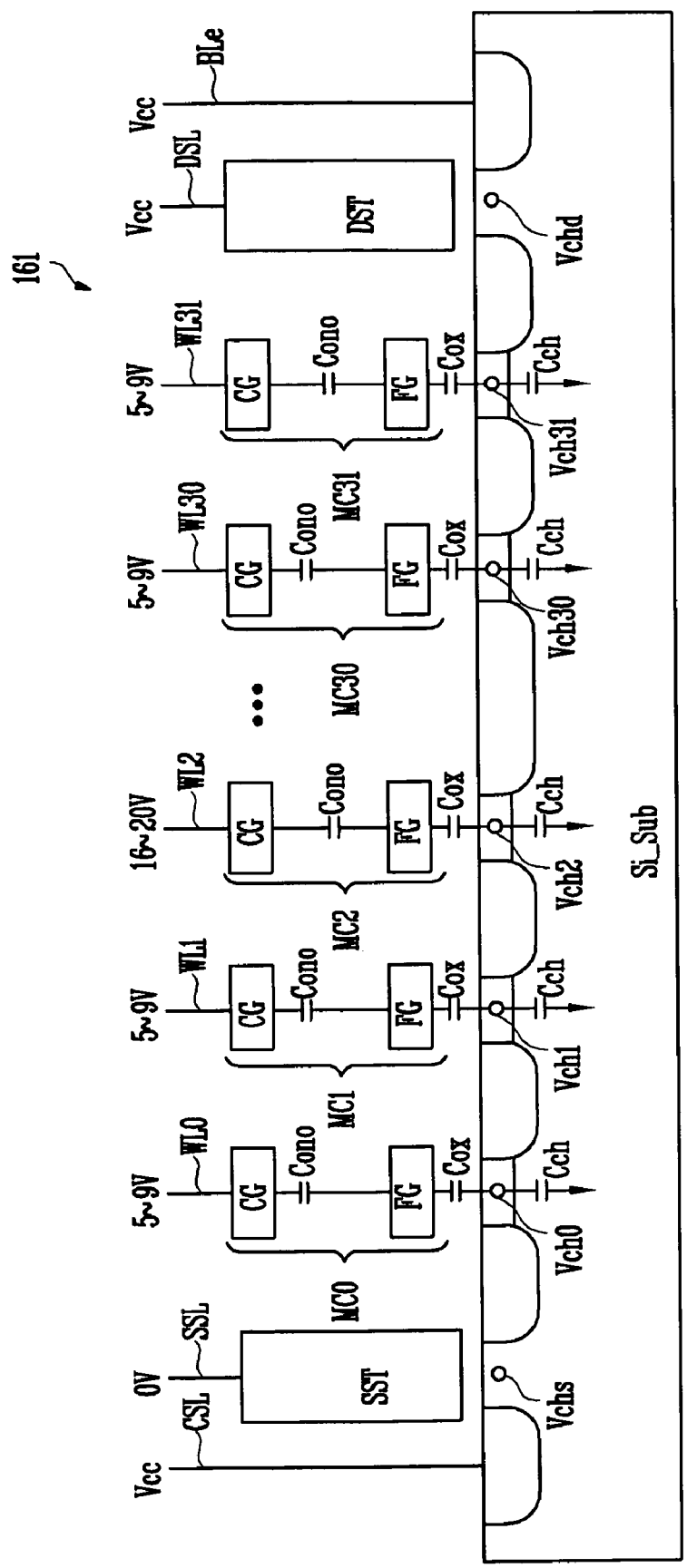
FIG. 15 is a sectional view of a non-selected string shown in FIG. 13.

FIG. 15 is a sectional view of a string 161 shown in FIG. 13. A method of preventing hot electron program disturbance will be described in detail with reference to FIG. 15.

Figure 1:
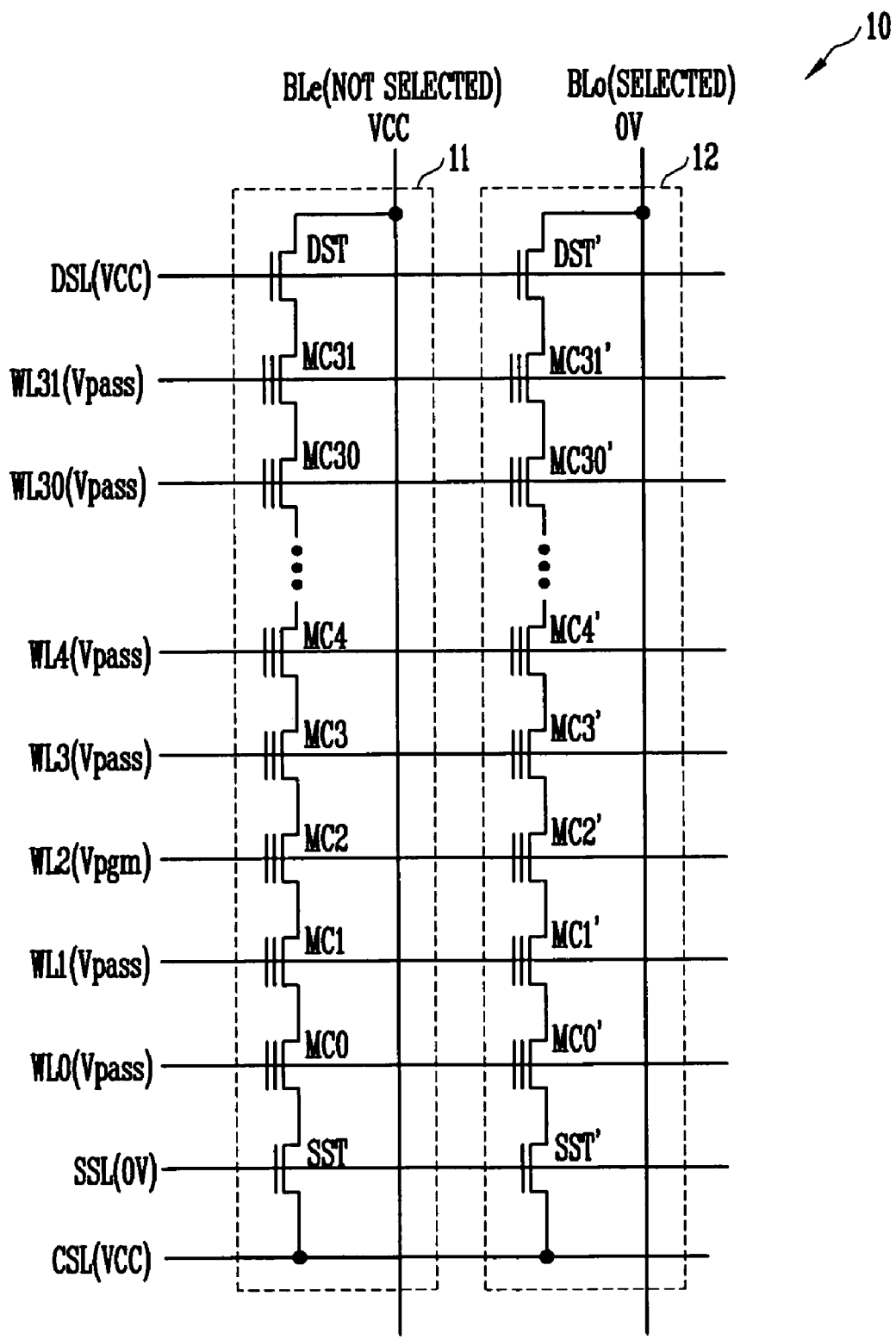
FIG. 1 is a circuit diagram of a conventional NAND flash memory device.
Figure 3:
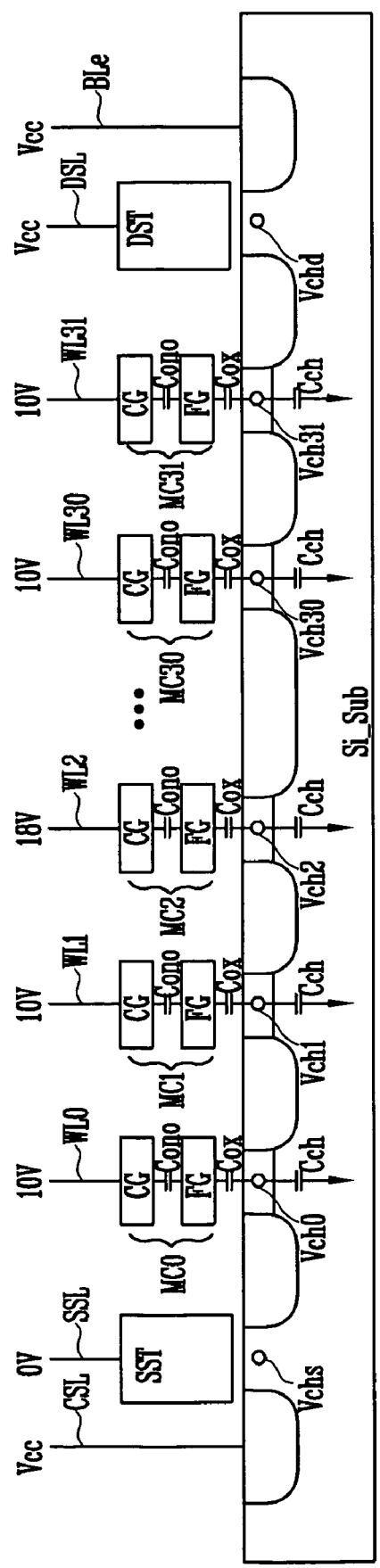
FIG. 3 is a sectional view of the NAND flash memory device shown in FIG. 1.
Figure 4:
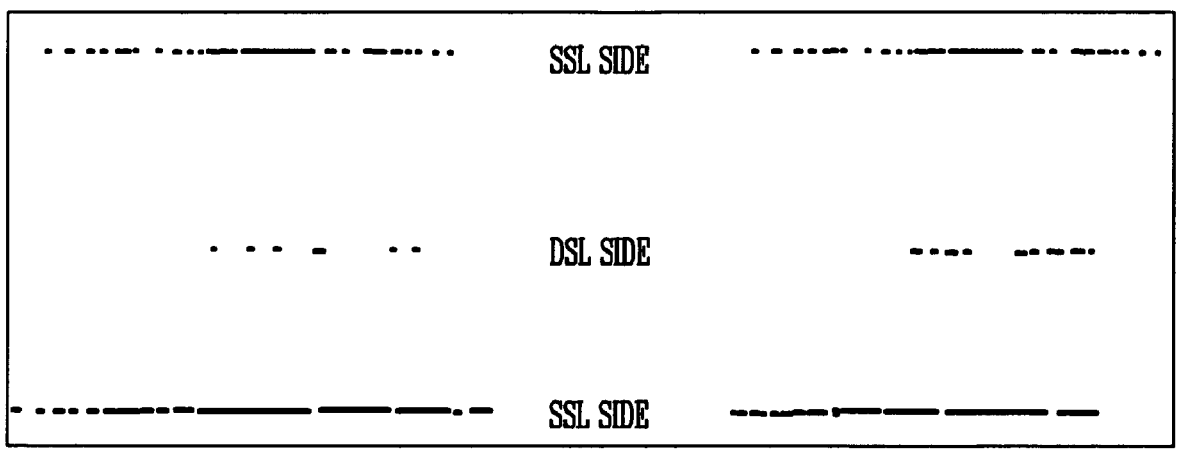
FIG. 4 is a view showing that fail bits are generated by channel boosting disturbance incurred by hot electrons in FIG. 1.
Figure 5:
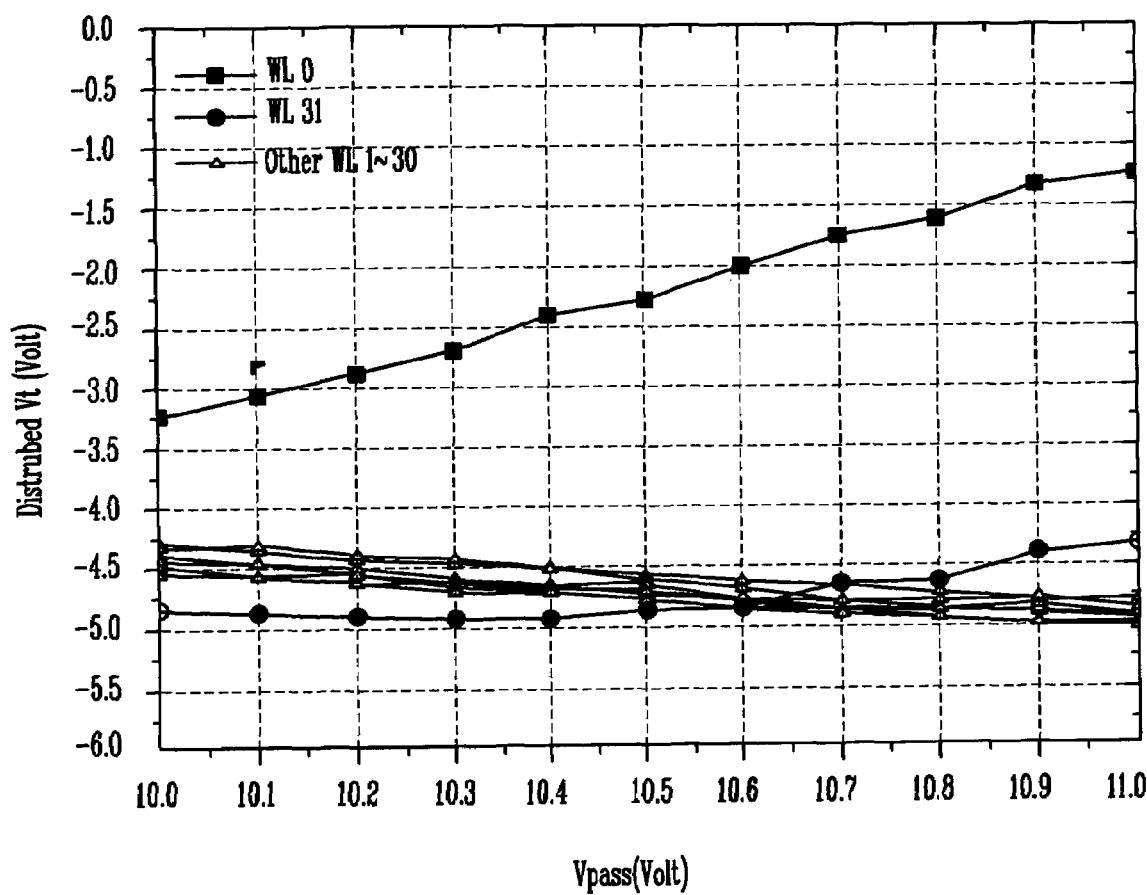
FIG. 5 is a graph showing the relation between the program-prohibit voltage (Vpass) and the threshold voltage (Vt) of cells in program disturbance by hot electrons.

Referring to FIG. 15, a word line (e.g., WL2) to be programmed is supplied with the program voltage (Vpgm) of 16 to 20V and the remaining word lines WL0, WL1, WL3 to WL31 are supplied with the program-prohibit voltage (Vpass) of 5 to 9V. If the voltage condition is fulfilled as shown in FIG. 5, an electric field between the source select transistor SST and the memory cell MC0 becomes weaker. An electric field between the drain select transistor DST and the memory cell MC31 also becomes weaker.

In one embodiment of the present invention, the channel Vchs of the source select transistor SST is fixed to a voltage of about 0V by its gate voltage (0V). Channel Vchd of the drain select transistor DST is fixed to a voltage of about 1V by its gate voltage (VCC). Channels Vch0, Vch1, Vch3 to Vch31 of the memory cells MC0, MC1, MC3 to MC31 are boosted to about 5 to 6V. It should be appreciated that the boosting voltage is not restricted by 5 to 6V. For example, the boosting voltage could also be about 8V or less.

In this embodiment, channels Vch0, Vch1, Vch3 to Vch31 are boosted to about 8V or less. Hot electron program disturbance due to phenomenon described with reference to FIG. 9 is not generated in the program-prohibit cell MC0, MC31.

Figure 16:
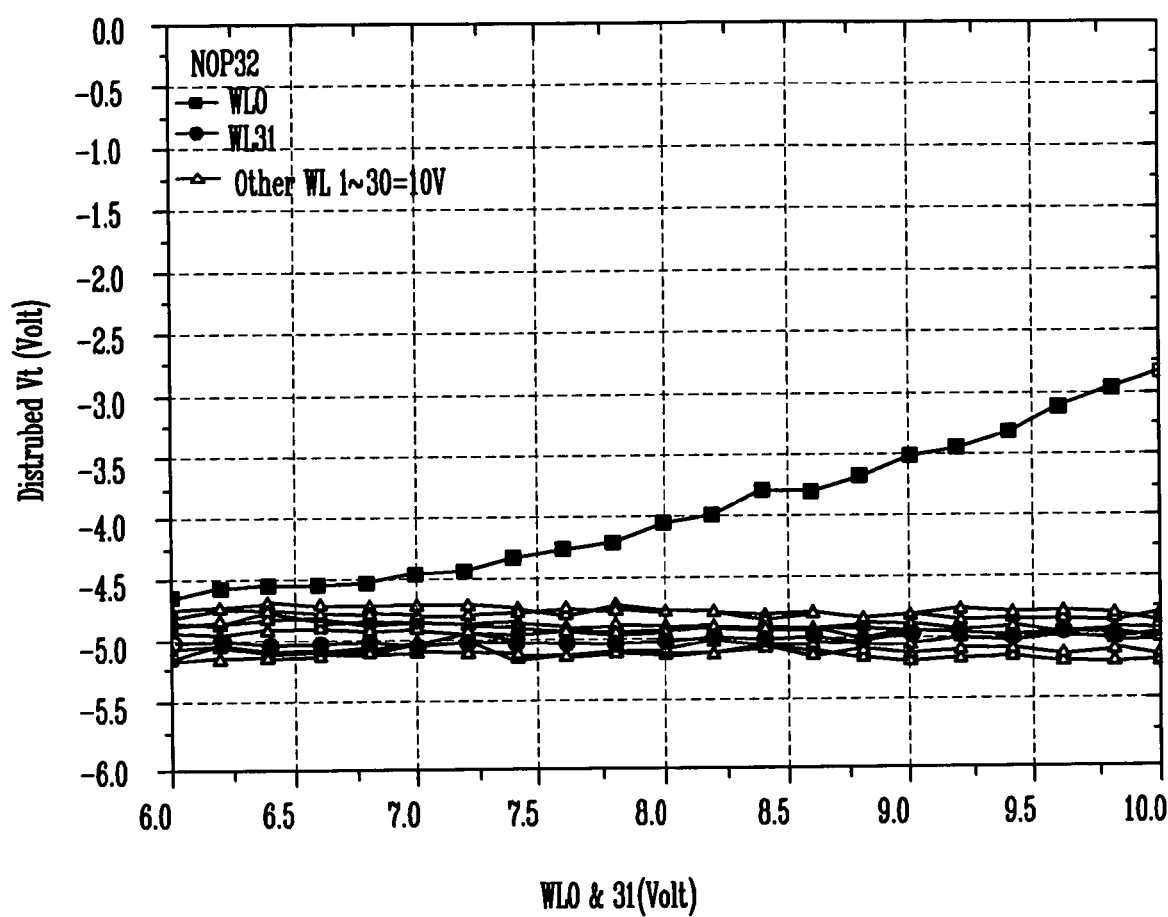
FIG. 16 is a graph showing the relation between the channel boosting disturb-prevention voltage (Vcbd) and the threshold voltage (Vt) of a cell in which program disturbance by hot electrons is prevented.

FIG. 16 shows the dependence between the threshold voltage (Vt) of the memory cells MC0, MC31 and the channel boosting disturb-prevention voltage (Vcbd) with the program-prohibit voltage (Vpass) being fixed to 10V and the channel boosting disturb-prevention voltage (Vcbd) being fixed to 6 to 10V or less.

In FIG. 16, Number of Program (NOP) decides a characteristic in which how many times will cells in one page be programmed. FIG. 16 shows that NOP is 32.

As shown in FIG. 16, the threshold voltage (Vt) of the memory cells MC1 to MC30 located in the word lines WL1 to WL30 does not vary greatly. The threshold voltage (Vt) of the memory cell WL0 increases when the voltage applied increases from 6V to 10V. However, the threshold voltage of memory cells MC0, MC31 located in the word lines WL0, WL31 does vary greatly if the channel boosting disturb-prevention voltage (Vcbd) applied to the word lines WL0, WL31 is reduced. For example, when the channel boosting disturb-prevention voltage (Vcbd) is 6V, i.e., as the channel boosting disturb-prevention voltage is lowered, it almost has the same characteristic as that of the threshold voltage (Vt) of the memory cells MC1 to MC30 of the word lines WL1 to WL30.

As described above, if a program-prohibit voltage and a channel boosting disturb-prevention voltage are applied to the remaining word lines other than a word line to be programmed according to the embodiments of the present invention, program disturbance incurred by hot electrons can be prevented from generating in memory cells whose program is prohibited.

It should be appreciated that the embodiments of the present invention can be applied to both a MLC and a SLC.

As described above, in accordance with the present invention, hot electron program disturbance, which is generated in memory cells connected to edge word lines adjacent to a source select line and a drain select line, can be prevented through a simple circuit construction.

Furthermore, since a wafer test step for screening fail incurred by hot electron program disturbance can be obviated, a wafer test time can be reduced.

Furthermore, since failure due to hot electron program disturbance can be obviated, the yield can be improved and margin between Vpass disturb and Vpgm disturb can be increased.

Although the foregoing description has been made with reference to the embodiments, it is to be understood that changes and modifications of the present invention may be made by those ordinarily skilled in the art without departing from the spirit and scope of the present invention and appended claims.

What is claimed is:

1. A non-volatile memory device, comprising:
   a memory cell array including N memory cells associated with N word lines, wherein the memory cell array is coupled in series between a drain select transistor and a source select transistor coupled to a common source line;
   a pump circuit that generates a program voltage and a program-prohibit voltage; and
   a voltage dividing unit that divides the program-prohibit voltage output from the pump circuit to generate a channel boosting disturb-prevention voltage lower than the program-prohibit voltage and applies the generated channel boosting disturb-prevention voltage to a first and $N^{th}$ word lines, the first and $N^{th}$ word lines being provided, respectively, at first and second ends of the word lines.

2. The non-volatile memory device as claimed in claim 1, wherein the voltage dividing unit comprises:
   a first voltage divider that applies the channel boosting disturb-prevention voltage to the first word line; and
   a second voltage divider that applies the channel boosting disturb-prevention voltage to the $N^{th}$ word line.

3. The non-volatile memory device as claimed in claim 1, wherein the channel boosting disturb-prevention voltage is 4V to 9V lower than the program-prohibit voltage.

4. The non-volatile memory device as claimed in claim 1, wherein the channel boosting disturb-prevention voltage is 4V to 7V lower than the program-prohibit voltage.

5. The non-volatile memory device as claimed in claim 1, wherein the voltage divider divides the program-prohibit voltage output from the pump circuit to generate a first channel boosting disturb-prevention voltage lower than the program-prohibit voltage and a second channel boosting disturb-prevention voltage lower than the first channel boosting disturb-prevention voltage, applies the generated first channel boosting disturb-prevention voltage to first and $N^{th}$ word lines of the word lines, and applies the generated second channel boosting disturb-prevention voltage to second and $(N-1)^{th}$ word lines that are the nearest to the first and $N^{th}$ word lines.

6. The non-volatile memory device as claimed in claim 5, wherein the voltage dividing unit comprises:
   a first voltage divider that applies the first channel boosting disturb-prevention voltage to the first word line;
   a second voltage divider that applies the first channel boosting disturb-prevention voltage to the $N^{th}$ word line;
   a third voltage divider that applies the second channel boosting disturb-prevention voltage to the second word line; and
   a fourth voltage divider that applies the second channel boosting disturb-prevention voltage to the $(N-1)^{th}$ word line.

7. The non-volatile memory device as claimed in claim 5, wherein the first channel boosting disturb-prevention voltage is 4 to 9V lower than the program-prohibit voltage, and the second channel boosting disturb-prevention voltage is 2 to 8V lower than the first channel boosting disturb-prevention voltage.

8. The non-volatile memory device as claimed in claim 5, wherein the first channel boosting disturb-prevention voltage is 4 to 7V lower than the program-prohibit voltage, and the second channel boosting disturb-prevention voltage is 2 to 6V lower than the first channel boosting disturb-prevention voltage.

9. The non-volatile memory device as claimed in claim 1, wherein the pump circuit further comprises a first group of switching elements for selectively switching the program voltage, and a second group of switching elements for selectively switching the program-prohibit voltage.

10. The non-volatile memory device as claimed in claim 9, wherein the number of the first and second groups of the switching element is the same as the number of the word lines, wherein each of the memory cells is a Single Level Cell (SLC).

11. The non-volatile memory device as claimed in claim 1, wherein each of the memory cells is a Multi-Level Cell (MLC).

* * * * *